United States Patent
Pang et al.

(10) Patent No.: US 11,323,608 B2
(45) Date of Patent: May 3, 2022

(54) IMAGE SENSORS WITH PHASE DETECTION AUTO-FOCUS PIXELS

(71) Applicant: OmniVision Technologies, Inc., Santa Clara, CA (US)

(72) Inventors: Chin Poh Pang, Pleasanton, CA (US); Chen-Wei Lu, San Jose, CA (US); Shao-Fan Kao, San Jose, CA (US); Chun-Yung Ai, San Jose, CA (US); Yin Qian, Milpitas, CA (US); Dyson Tai, San Jose, CA (US); Qingwei Shan, San Jose, CA (US); Lindsay Grant, Campbell, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/597,901

(22) Filed: Oct. 10, 2019

(65) Prior Publication Data

US 2020/0045223 A1 Feb. 6, 2020

Related U.S. Application Data

(63) Continuation-in-part of application No. 16/017,566, filed on Jun. 25, 2018, now abandoned.

(51) Int. Cl.
*H04N 5/232* (2006.01)
*H01L 27/146* (2006.01)

(52) U.S. Cl.
CPC ..... *H04N 5/23212* (2013.01); *H01L 27/1463* (2013.01); *H01L 27/14605* (2013.01); *H01L 27/14621* (2013.01); *H01L 27/14623* (2013.01); *H01L 27/14627* (2013.01)

(58) Field of Classification Search
CPC .............. H04N 5/23212; H04N 5/3696; H01L 27/14605; H01L 27/1463; H01L 27/14627; H01L 27/14623; H01L 27/14621; H01L 27/14645
See application file for complete search history.

(56) References Cited

U.S. PATENT DOCUMENTS

| | | | |
|---|---|---|---|
| 5,796,154 A * | 8/1998 | Sano ................. | H01L 27/14621 257/432 |
| 2012/0086093 A1* | 4/2012 | Otsuka .............. | H01L 27/14623 257/432 |
| 2016/0269662 A1* | 9/2016 | Hepper ............. | H01L 27/14627 |

* cited by examiner

*Primary Examiner* — Padma Haliyur (57) ABSTRACT

An image sensor pixel array comprises a plurality of image pixel units to gather image information and a plurality of phase detection auto-focus (PDAF) pixel units to gather phase information. Each of the PDAF pixel units includes two of first image sensor pixels covered by two micro-lenses, respectively. Each of the image pixel units includes four of second image sensor pixels adjacent to each other, wherein each of the second image sensor pixels is covered by an individual micro-lens. A coating layer is disposed on the micro-lenses and forms a flattened surface across the whole image sensor pixel array. A PDAF micro-lens is formed on the coating layer to cover the first image sensor pixels.

15 Claims, 9 Drawing Sheets

IMAGE SENSORS WITH PHASE DETECTION AUTO-FOCUS PIXELS

CROSS-REFERENCE TO RELATED APPLICATION

This application is a continuation-in-part of U.S. patent application Ser. No. 16/017,566, filed Jun. 25, 2018.

TECHNICAL FIELD

This disclosure relates generally to semiconductor image sensors, and in particular but not exclusively, relates to image sensors with micro-lens (ML) phase detection auto-focus (PDAF) pixels.

BACKGROUND INFORMATION

Image sensors have become ubiquitous. They are widely used in digital still cameras, cellular phones, security cameras, as well as medical, automotive and other applications. Some applications such as automatic focusing and three dimensional (3D) imaging may require electronic devices to provide stereo and/or depth sensing capabilities. Such image sensor devices usually include both image pixels and phase detection auto-focus (PDAF) pixels in a single image sensor. With this type of arrangement, a camera can use the on-chip PDAF pixels to focus an image without requiring a separate phase detection sensor. In a typical arrangement, PDAF pixels all have the same color and are arranged consecutively in a line in the pixel array. When PDAF pixels are arranged in this way, optical crosstalk becomes problematic. For example, optical cross talk between a green image pixel and a green PDAF pixel may be more difficult to correct than optical cross talk between a green image pixel and a red image pixel. It would therefore be desirable to provide improved PDAF pixel with less optical cross talk.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with both PDAF pixels and image pixels are described herein. In the following description, numerous specific details are set forth to provide a thorough understanding of the examples. However, one skilled in the relevant art will recognize that the techniques described herein can be practiced without one or more of the specific details, or with other methods, components, materials, etc. In other instances, well-known structures, materials, or operations are not shown or described in details in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

Figure 1:
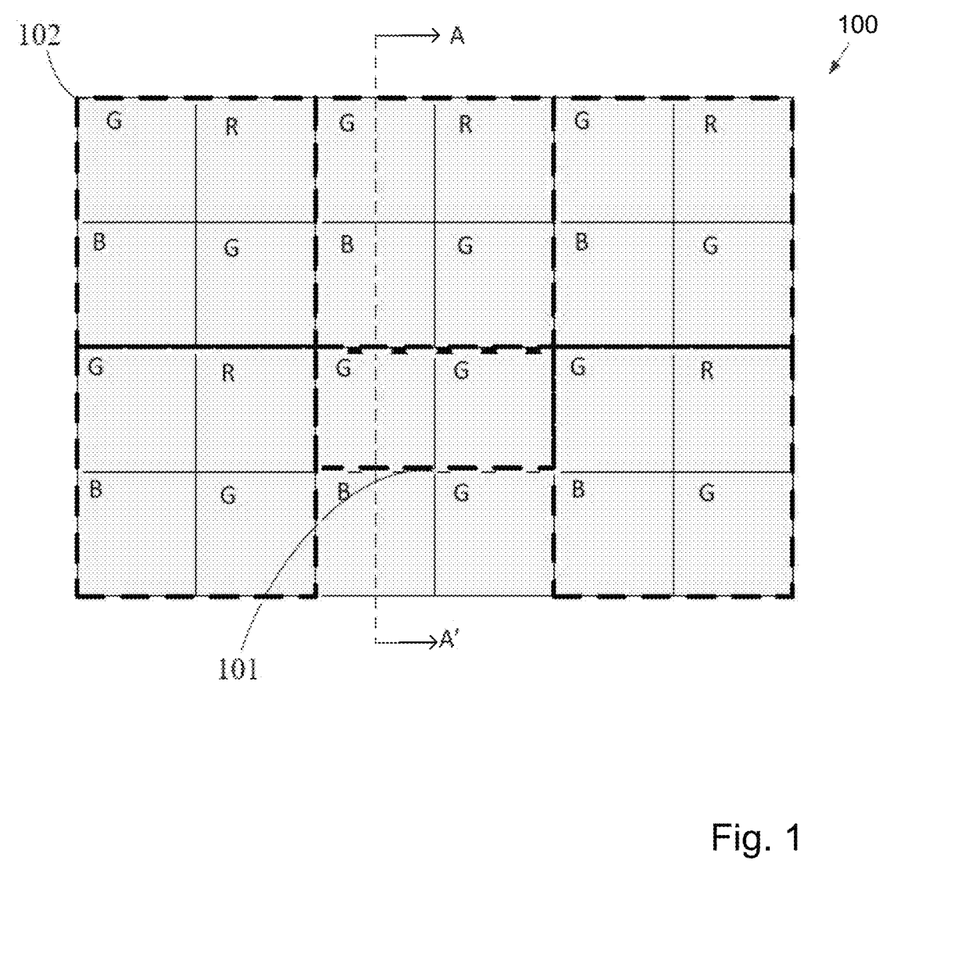
FIG. 1 is a top-down view of an image sensor pixel array with both PDAF pixels and image pixels, in accordance with an embodiment of the invention.

FIG. 1 is a top-down view of an image sensor pixel array 100 comprising a plurality of image pixel units 102 to gather image information and a plurality of phase detection auto-focus (PDAF) pixel units 101 to gather phase information, in accordance with an embodiment of the invention. Each of the PDAF pixel units 101 includes two of first image sensor pixels adjacent to each other and arranged with a two-by-one pattern which is distributed across the whole image sensor pixel array to collect phase information with various angular responses. Each of the image pixel units 102 includes four of second image sensor pixels adjacent to each other and arranged with a two-by-two pattern which is repeated across the whole image sensor pixel array to collect image information. Each of the first image sensor pixels includes a first photodiode (PD) disposed in a semiconductor substrate 212. Each of the second image sensor pixels includes a second PD disposed in the semiconductor substrate 212, wherein the second PD may be identical as the first PD. Each of the PDAF pixel units 101 may be substantially or completely surrounded by image pixel units 102.

As depicted in FIG. 1, the image sensor pixel array 100 also includes a color filter array. Anyone of the first image sensor pixels and the second image sensor pixels marked with an R includes a red color filter, marked with a G includes a green color filter, and marked with a B includes a blue color filter. The color filters in the image pixel units 102 is a Bayer mosaic pattern which includes two green second image pixels arranged on one diagonal and one red and one blue second image pixel arranged on the other diagonal. The use of red, green, and blue color filters in FIG. 1 is merely illustrative. If desired, the color filter patterns may include broadband filters, too. For example, each two-by-two image pixel unit 102 may include one pixel having a broadband filter. In general, any suitable color filter pattern and any suitable type of color filter may be used in image sensor pixel array 100. As an example in FIG. 1, the color filters in the PDAF pixel units 101 are forming with same green color filters, which disrupt the Bayer mosaic patterns of pixel array 100. The color filters in the PDAF pixel units 101 may also be formed with different color filters, which may not disrupt the Bayer mosaic patterns of pixel array 100.

Figure 2:
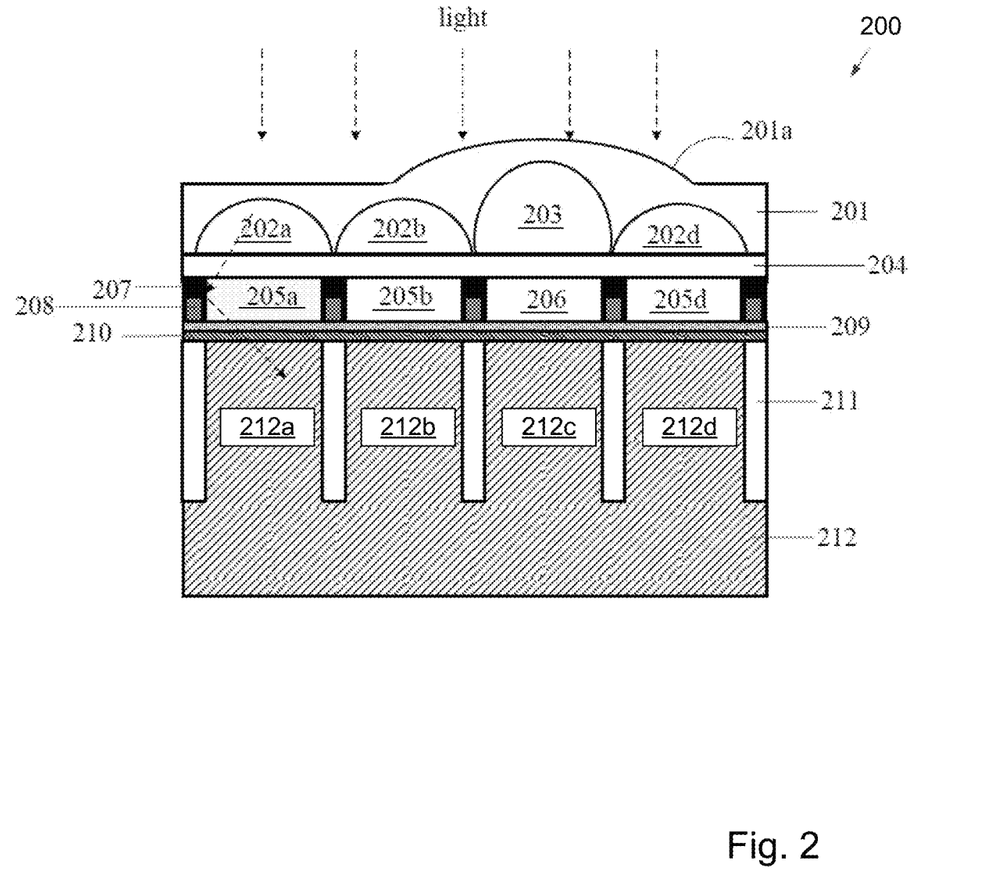
FIG. 2 is a cross-sectional view of the image sensor pixel array in FIG. 1 along A-A' direction, in accordance with an embodiment of the invention.

As a depicted example, FIG. 2 is a cross-sectional view of an image sensor pixel array 200 along A-A' direction in FIG. 1, in accordance with an embodiment of the invention. PD 212c is disposed in the semiconductor substrate 212 and is one of the two adjacent first PDs in a PDAF pixel unit 101 in FIG. 1. PD 212a, 212b and 212d are three second PDs in two image pixel units 102 which are adjacent to a PDAF pixel unit 101. As an example, the first and second photo-diodes (PD) may be identical and adjacent to each other and electrically/optically isolated by an isolation region 211 in between. The isolation region 211 may be formed by a diffusion isolation region or a trench isolation region. A high k dielectric layer 210 and a first interlayer dielectric layer 209 are disposed on the semiconductor substrate 212. The high k dielectric layer 210 is used to form a P+ pinning layer on the semiconductor substrate 212 in order to reduce the hot electron induced dark current.

As a depicted example in FIG. 2, a color filter array is disposed on the first interlayer dielectric layer 209, wherein each of color filters is aligned with one PD underneath of the color filter. As an example, color filter 205a is a green color filter aligned with PD 212a, color filter 205b is a blue color filter aligned with PD 212b, color filter 205d is a blue color filter aligned with PD 212d, and color filter 206 is a green color filter aligned with PD 212c. The color filters are adjacent to each other and separated by a metal grid in between. The metal grid comprises a reflective layer 208 and a dielectric layer 207. The reflective layer 208 comprises at least one of Al, Cr, Mo and Ti, and is used to reflect incident lights into the respective PD region in order to reduce the optical cross talk between adjacent PDs. The dielectric layer 207 covers the reflective layer 208 to improve the adhesion between the reflective layer 208 and the color filters. The dielectric layer 207 comprises silicon oxide and silicon nitride.

As a depicted example in FIG. 2, a second interlayer dielectric layer 204 is disposed on the color filter array to protect the color filters. A micro-lens array is disposed on the second interlayer dielectric layer 204 and on an illuminated side of image sensor pixel array 200. Each PD in the image pixel units 102 is aligned with an individual second micro-lens, and each pair of PDs in the PDAF pixel units 101 is aligned with a shared first micro-lens. As an example, a second micro-lens 202a is aligned with PD 212a, a second micro-lens 202h is aligned with PD 212b, and a second micro-leas 202d is aligned with PD 212d. The second micro-lenses 202a, 202b and 202d have the uniform size. The first micro-lens 203 is aligned with both PD 212c and its adjacent PD (not shown in FIG. 2) inure same PDAF pixel unit 101. Because the first micro-lens 203 covers two PDs but the second micro-lens 202a/202b/202d covers only one PD, the first micro-lens 203 is bigger and taller than the second micro-lenses 202a/202b/202d. As an example, a refractive index of the second interlayer dielectric layer 204 is nut lower than a refractive index of the first micro-lens 203 and a refractive index of the second micro-lens 202a/202b/202d.

As a depicted example in FIG. 2, all micro-lenses 202a/202b/202d/203 are covered by a first coating layer 201 with a refractive index lower than a refractive index of the micro-lenses 202a/202b/202d/203. As one example, the refractive index of the micro-lenses 202a/202b/202d/203 is approximately 1.66 while the refractive index of the first coating layer 201 is approximately 1.25. Because the first micro-lens 203 is bigger and taller than the second micro-lens 202a/2021o/202d, the first coating layer 201 is disposed by following the shape of the first micro-lens 203 and consequently forms a non-flattened surface 201a across the whole micro-lens array. Such non-flattened surface 201a may cause undesirable optical cross talk between adjacent PDs, and degrade the optical performance of the image sensor.

Figure 3:
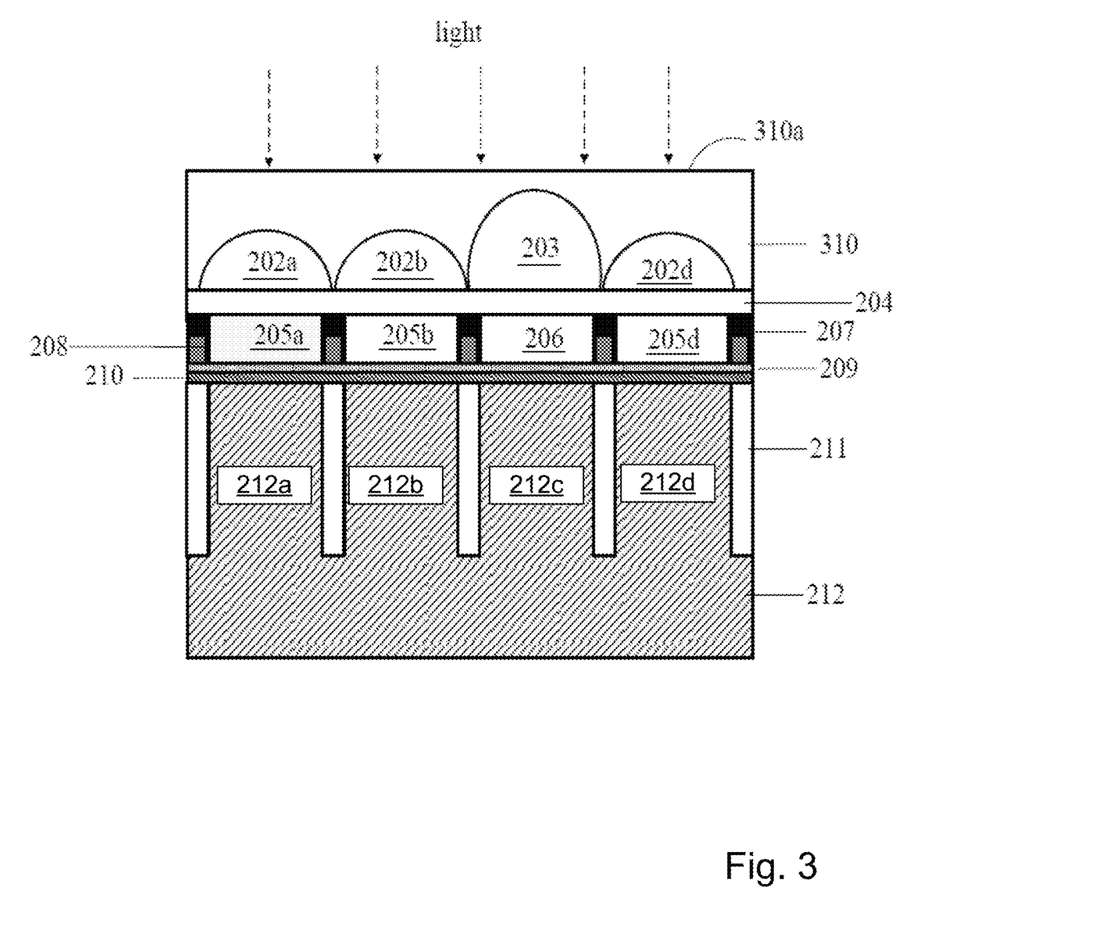
FIG. 3 is a cross-sectional view of the image sensor pixel array in FIG. 1 along A-A' direction, in accordance with an embodiment of the invention.

In order to eliminate the non-flattened surface 201a across the whole micro-lens array, a second coating layer 310 is disposed on the top of the whole micro-lens array and then followed by a flattening process to form a flattened surface 310a across the whole micro-lens array (FIG. 3). The flattening process may be a chemical mechanism polishing (CMP), a wet etch, a dry etch or any combination of these process steps. The second coating layer 310 comprises the same material as the first coating layer 201.

Figure 4:
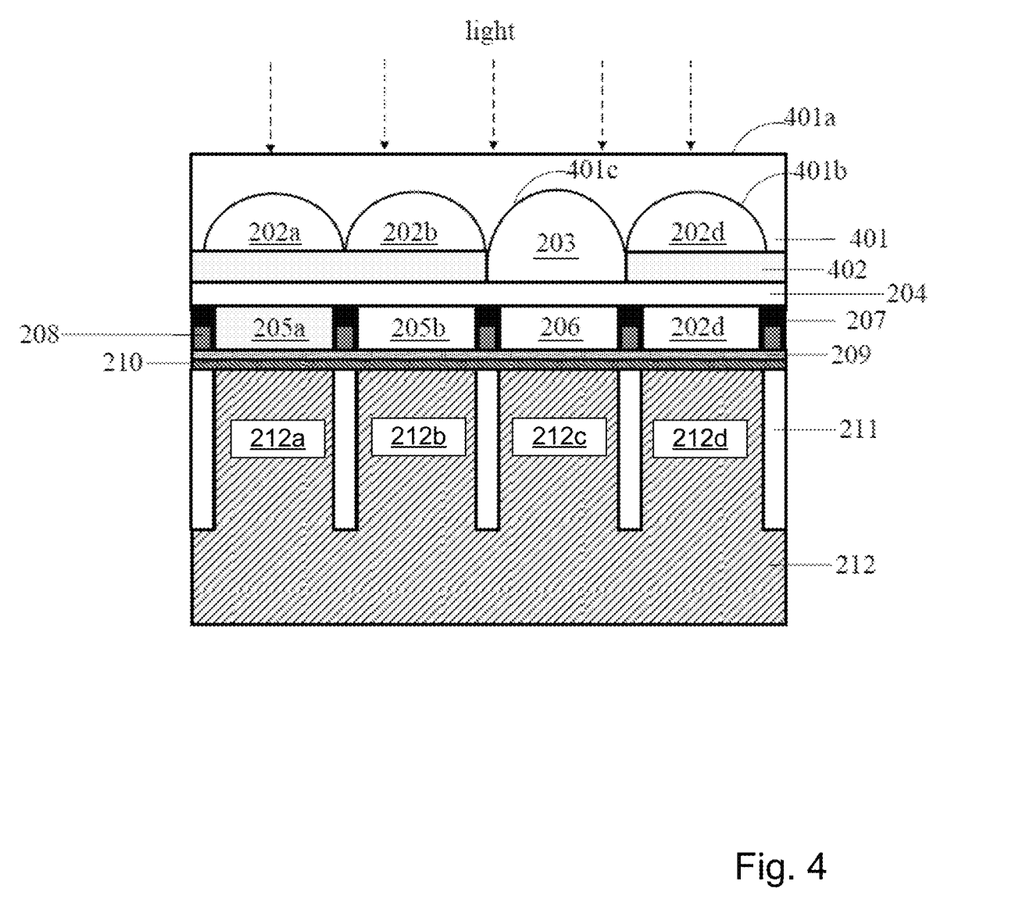
FIG. 4 is a cross-sectional view of the image sensor pixel array in FIG. 1 along A-A' direction, in accordance with an embodiment of the invention.

As an example in FIG. 4, the second micro-lenses 202a/202b and 202d may also be disposed on the surface of a third interlayer dielectric layer 402 which is disposed on the surface of the second interlayer dielectric layer 204. As an example, a refractive index of the third interlayer dielectric layer 402 is not higher than a refractive index of the first micro-lens 203 and a refractive index of the second micro-lens 202a/202b/202d. The first micro-lens 203 is still disposed on the surface of the second interlayer dielectric layer 204. The third interlayer dielectric layer 402 has a thickness matching the height difference between the first micro-lens 203 and the second micro-lenses 202a/202b/202d. As a result, when a third coating layer 401 is disposed on the whole micro-lens array, a top surface 401b of the second micro-lens 202a/202b/202d is at the same level as a top surface 401c of the first micro-lens 203. As a result, a flat surface 401a may be formed across the whole micro-lens array. The third coating layer 401 comprises the same material as the first coating layer 201 in FIG. 2.

Figure 5:
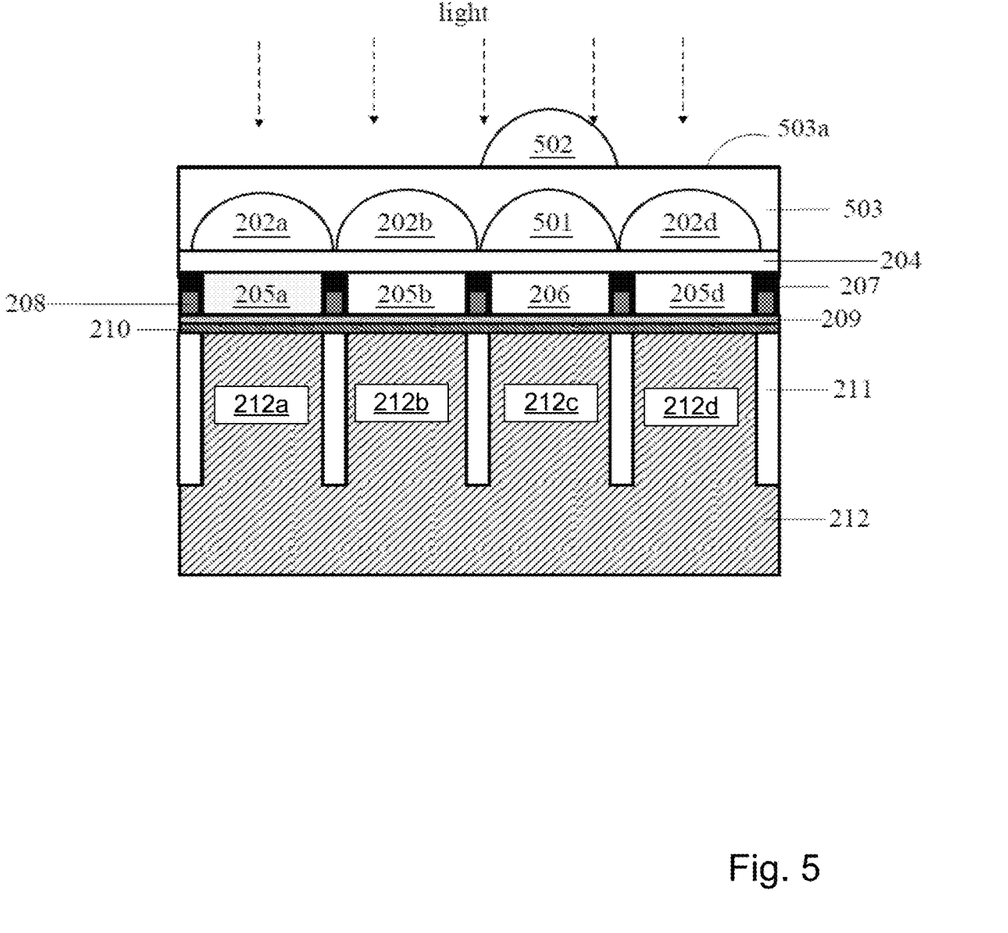
FIG. 5 is a cross-sectional view of the image sensor pixel array in FIG. 1 along A-A' direction, in accordance with an embodiment of the invention.

As an example in FIG. 5, the first micro-lens 203 in FIG. 2 for PDAF pixel units is replaced by a fourth micro-lens 501 and a third micro-lens 502. The fourth micro-lens 501 comprises the same material as the second micro-lens 202a/202b/202d, and has the same size as the second micro-lens 202a/202b/202d. Since the micro-lens 202a/202b/202d and 501 are uniform, a flat surface 503a could be formed when a fourth coating layer 503 is disposed on the micro-lens array. The fourth coating layer 503 comprises the same material as the first coating layer 201 in FIG. 2. The third micro-lens 502 is disposed on the flat surface 503a and aligned with the fourth micro-lens 501. The incident light is focused by the third micro-lens 502 first and then the fourth micro-lens 501. The final focused incident light reaches the same PD region 212e in the semiconductor substrate 212 but with less optical cross talk compared to the incident light focused by the first micro-lens 203 only in FIG. 2. In an example, a refractive index of the third micro-lens 502 may be lower than the refractive index of the fourth coating layer 503.

Figure 6:
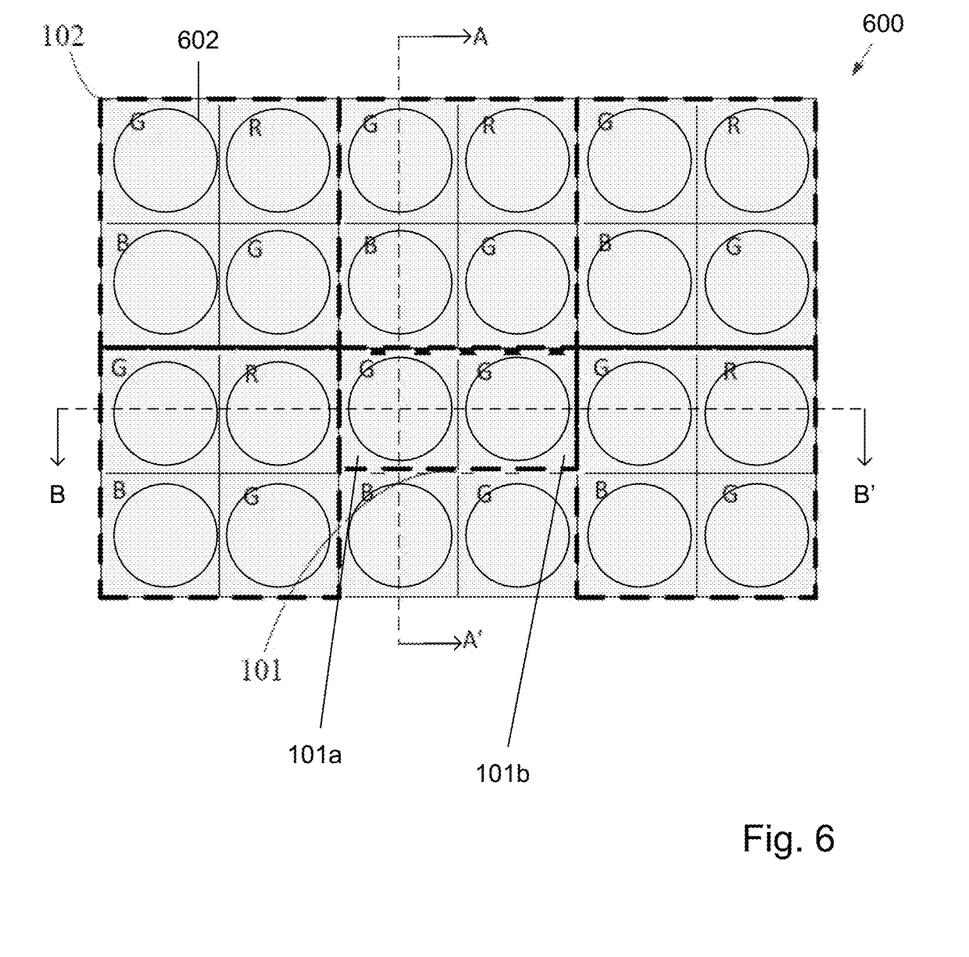
FIG. 6 is similar to FIG. 1, in accordance with an embodiment of the invention.

FIG. 6 is similar to FIG. 1, in accordance with an embodiment of the invention. FIG. 6 is a top-down view of an image sensor pixel array 600 comprising a plurality of image pixel units 102 to gather image information and a plurality of phase detection auto-focus (PDAF) pixel units 101 to gather phase information. Each image pixel unit 102 may include four of second image sensor pixel or image pixels, and each image pixel includes a second micro-lens, which may be a micro-lens 602. In other words, image sensor pixel array 600 comprises a plurality of image pixels to gather image information. Each PDAF pixel unit may be substantially surrounded by the image pixels. Each PDAF pixel unit 101 may include two adjacent first image sensor pixels or PDAF pixels 101a and 101b (e.g., FIGS. 7 and 8), and each PDAF pixel includes a first micro-lens, which may be the same micro-lens 602. For clarity, a second image sensor pixel will be referred to as image pixel, and a first image sensor pixel will be referred to as PDAF pixel. Each PDAF pixel unit may include a single PDAF pixel (e.g., FIG. 9). Each PDAF pixel unit includes at least one PDAF pixel.

Figure 7:
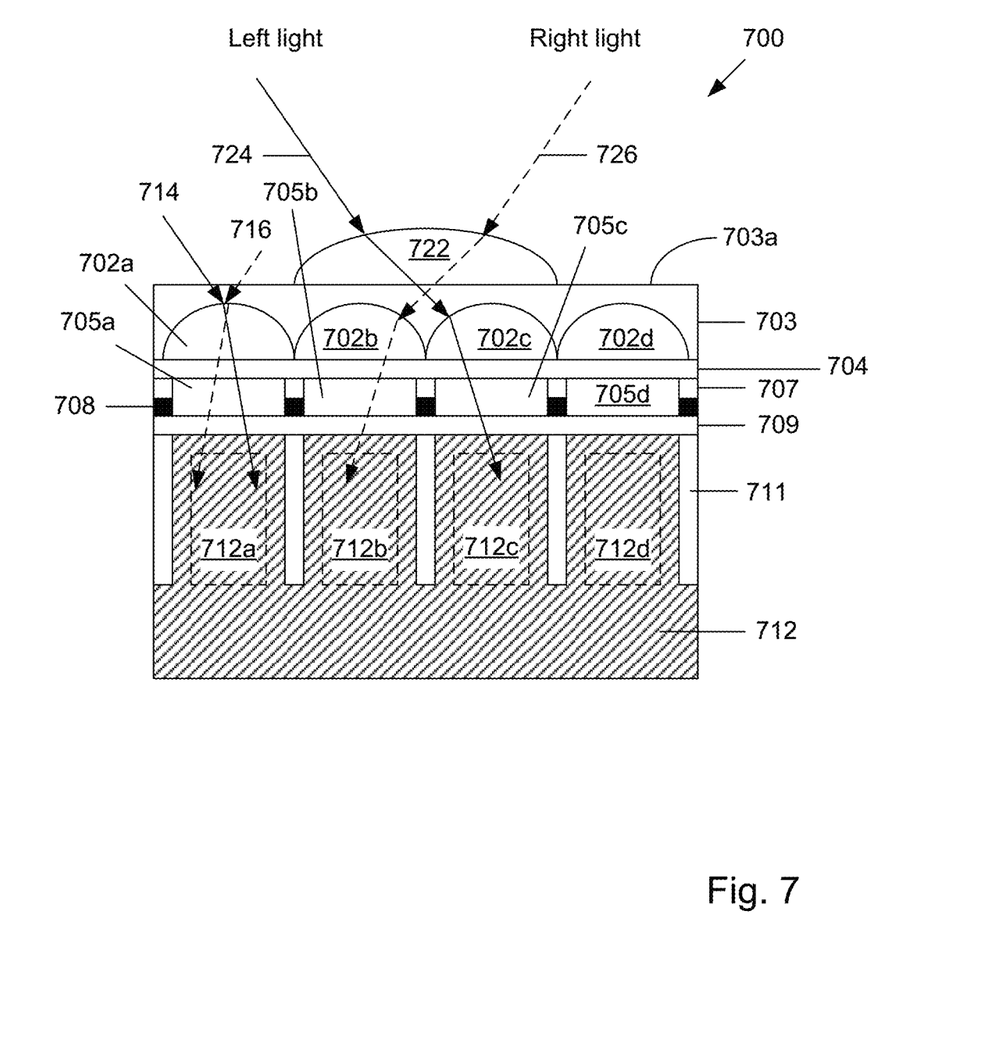
FIG. 7 is a cross-sectional view of the image sensor pixel array in FIG. 6 along B-B' direction, in accordance with an embodiment of the invention.

As a depicted example, FIG. 7 is a cross-sectional view of the image sensor pixel array 700 along B-B' direction in FIG. 6, in accordance with an embodiment of the invention. First PDs 712b and 712c are disposed in the semiconductor substrate 712 in a first PDAF pixel 101a and a second PDAF pixel 101b, respectively. First PDAF pixel 101a and second PDAF pixel 101b are shown in FIG. 6. Second PDs 712a and 712d are in two image pixels, which are adjacent to first PDAF pixel 101a and second PDAF pixel 101b, respectively. As an example, PDs 712a/712b/712c/712d may be identical and adjacent to each other and electrically/optically isolated by an isolation region 711 in between. The isolation region 711 may be formed by a diffusion isolation region or a trench isolation region. A first interlayer dielectric layer 709 may be disposed on the semiconductor substrate 712. A high k dielectric layer may be optionally disposed between the semiconductor substrate 712 and the first interlayer dielectric layer 709. The high k dielectric layer may be used to form a P+ pinning layer on the semiconductor substrate 712 in order to reduce the hot electron induced dark current.

As a depicted example in FIG. 7, a color filter array is disposed on the first interlayer dielectric layer 709, wherein each of color filters is aligned with one PD underneath of the color filter. As an example shown along line BB' of FIG. 6, color filter 705a is a red color filter aligned with PD 712a, color filter 705b is a green color filter aligned with PD 712b, color filter 705c is a green color filter aligned with PD 712c, and color filter 712d is a green color filter aligned with PD 712c. The color filters are adjacent to each other and separated by a metal grid in between. The metal grid comprises a reflective layer 708 and a dielectric layer 707. The reflective layer 708 comprises at least one of Al, Cr, Mo and Ti, and is used to reflect incident lights into the respective PD region in order to reduce the optical cross talk between adjacent PDs. The dielectric layer 707 covers the reflective layer 208 to improve the adhesion between the reflective layer 708 and the color filters. The dielectric layer 707 comprises silicon oxide and silicon nitride.

As a depicted example in FIG. 7, a second interlayer dielectric layer 704 is disposed on the color filter array to protect the color filters. A micro-lens array is disposed on the second interlayer dielectric layer 704 and on an illuminated side of the image sensor pixel array 700. Each PD is aligned with an individual micro-lens. As an example, a second micro-lens 702a is aligned with second PD 712a, a first micro-lens 702b is aligned with first PD 712b, a first micro-lens 702c is aligned with first PD 712c, and a second micro-lens 702d is aligned with second PD 712d. As an example, a refractive index of the second interlayer dielectric layer 704 is not lower than a refractive index of first micro-lenses 702b/702c and second micro-lenses 702a/702d.

As an example in FIG. 7, four micro-lenses 702a/702b/702c/702d may comprise the same material and have the same size. The first micro-lens is identical to the second micro-lens. Since micro-lenses 702a/702b/702c/702d are uniform, a flat surface 703a across image sensor pixel array 700 could be formed when a coating layer 703 is disposed on the micro-lens array comprising first micro-lenses and second micro-lenses. A PDAF micro-lens 722 is disposed on the flat surface 703a and aligned with micro-lenses 702b and 702c. PDAF micro-lens 722 covers PDs 712b and 712c. PDAF micro-lens covers PDAF pixel unit 101 of FIG. 6. No lens on coating layer 703 covers image pixels. Common characteristics shown in FIG. 2 may not be repeated.

A half of incident light, e.g., left light 724, is directed and focused to PD 712c through the left half of PDAF micro-lens 722 and micro-lens 702c, and another half of incident light, e.g., right light 726, is directed and focused to PD 712b through the right half of PDAF micro-lens 722 and micro-lens 702b. PD 712b is included in first PDAF pixel 101a and PD 712c is included in second PDAF pixel 101b of FIG. 6. Thus, PDs 712b and 712c will gather phase information from an input scene. The focused incident light reaches PDs 712b and 712c in the semiconductor substrate 712 with less optical cross talk compared to the incident light focused by the first micro-lens 203 only in FIG. 2, because in addition to PDAF micro-lens 722, left light 724 and right light 726 pass extra micro-lenses 702e and 702b, respectively, and thus are further separated. For comparison, left light 714 and right light 716 are focused to the same PD 712a of an image pixel.

In an example, a refractive index of PDAF 722 may be lower than the refractive index of the coating layer 703. Micro-lenses 702a/702b/702c/702d may be etched micro-lenses, which are not reflowed. Micro-lenses 702a/702b/702c/702d may be made of photoresist materials. PDAF micro-lens 722 may be reflowed. PDAF micro-lens 722 may be made of the same or different photoresist materials. In an embodiment, PDAF micro-lens 722 may cover a PDAF pixel unit including four first image sensor pixels or PDAF pixels arranged with a two-by-two pattern.

Figure 8:
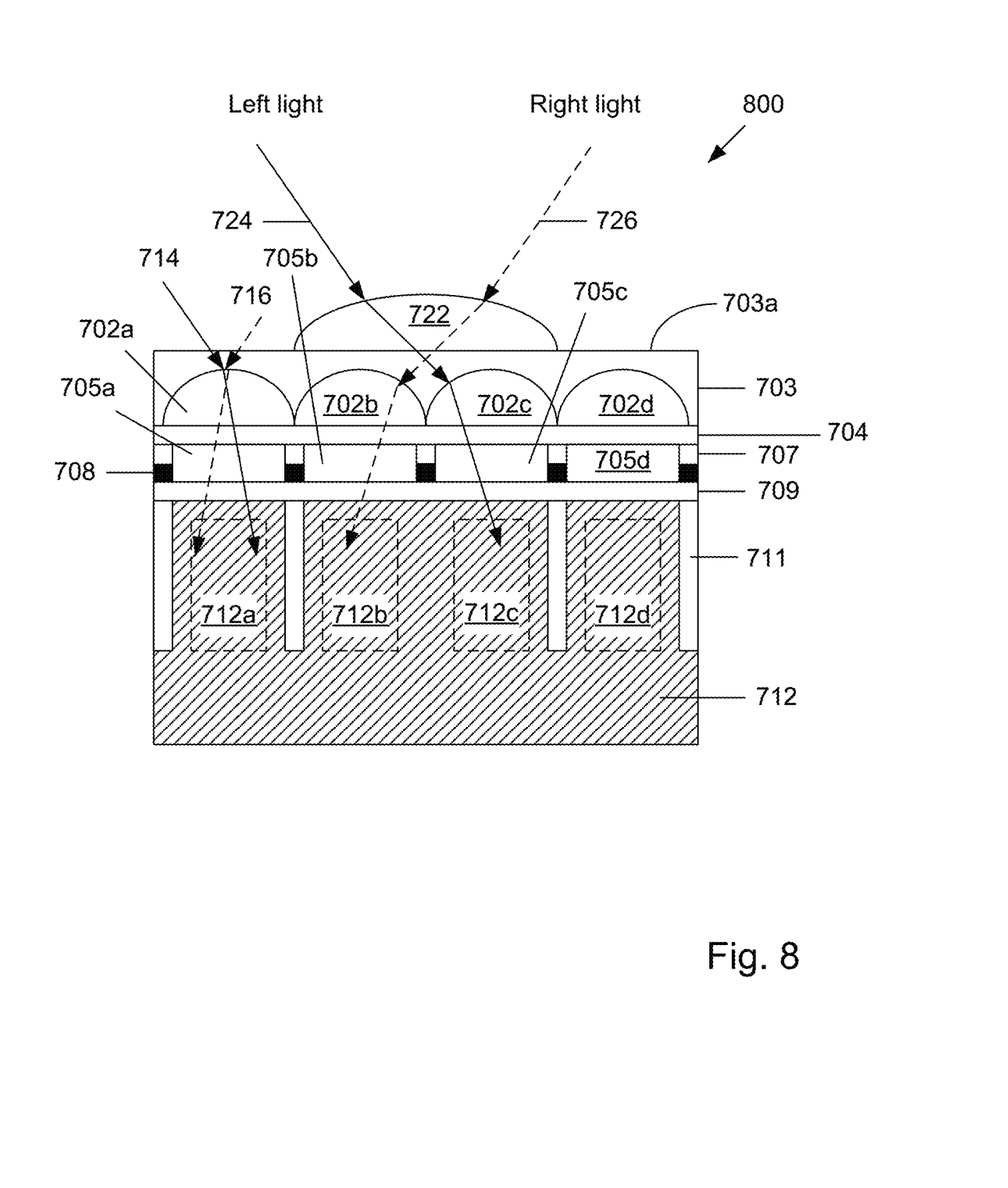
FIG. 8 is similar to FIG. 7, in accordance with an embodiment of the invention.

FIG. 8 is an alternative embodiment similar to FIG. 7, in accordance with an embodiment of the invention. As a depicted example, FIG. 8 is a cross-sectional view of the image sensor pixel array 800 along B-B' direction in FIG. 6. Image sensor pixel array 800 does not have an isolation region 711 between PDs 712b and 712c. In an embodiment, the performance of PDAF would be better without isolation region 711 between PDs 712b and 712c.

Figure 9:
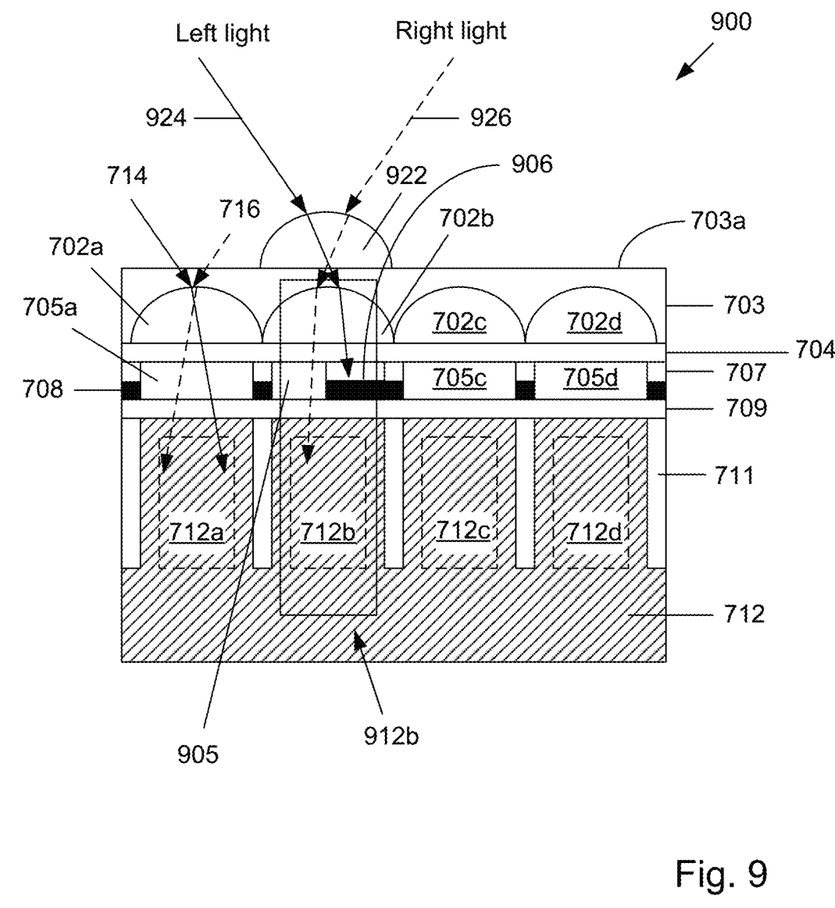
FIG. 9 is a cross-sectional view of the image sensor pixel array in FIG. 6 along B-B' direction, in accordance with an embodiment of the invention.

As a depicted example, FIG. 9 is a cross-sectional view of the imaging sensor pixel array 900 along B-B' direction in FIG. 6, in accordance with an embodiment of the invention. In FIG. 6, each image pixel unit 102 may include four of second image sensor pixel or image pixels. Each PDAF pixel unit may be substantially sounded by the image pixels. Each PDAF pixel unit may include a single PDAF pixel, e.g., pixel 101*a*. In an embodiment, pixel 101*a* is a half-shield (HS) PDAF pixel, pixel 101*b* is an image pixel. Accordingly, in FIG. 9, a pixel 912*b* including PD 712*b* and micro-lens 702*b* is a HS PDAF pixel, while other pixels are image pixels. For example, HS PDAF pixel 912*b* comprises a clear (no color) filter 905 in a left half of pixel 912*b*, and a light shield (half shield) 906 in a right half of pixel 912*b*. The half shield 906 blocks a left half 924 of the incident light, and a right half 926 of the incident light passes through the clear filter in the left half of HS PDAF pixel 912*b*. In an embodiment, HS PDAF pixel 912*b* may comprise a clear (no color) filter 905 in a right half of pixel 912*b*, and a light shield 906 in a left half of pixel 912*b*. The space on the top of light shield 906 may be filled with a transparent or non-transparent material.

Similar to FIG. 7, a flat surface 703*a* could be formed when a coating layer 703 is disposed on the micro-lens array 702*a*/702*b*/702*c*/702*d*. A PDAF micro-lens 922 is disposed on the flat surface 703*a* and aligned with micro-lens 702*b*. PDAF micro-lens 922 cover HS PDAF pixel 912*b* only.

A half of incident light, e.g., left light 924, is directed to and blocked by light shield 906, and another half of incident light, e.g., right light 926, is directed and focused to PD 712*b* through clear filter 905. Right light 926 may pass through the right half of PDAF micro-lens 922 and micro-lens 702*b* to achieve PD 712*b*. Pixel 912*b* may be a right-light HS PDAF pixel. A left-light HS PDAF pixel will allow left light 924 to achieve its PD. Thus, PD 712*b* with a PD of the left-light HS PDAF pixel will gather phase information from an input scene. Pixel 912*b* may be referred to as right-light HS PDAF pixel, which detects only right light 926 from the input scene. Pixel 912*b* may be referred to as left light HS PDAF pixel, if light shield 906 is disposed at the left side of pixel 912*b* blocking right light 926, and clear filter 905 is disposed at the right side of pixel 912*b* to pass left light 924 to enter PD 712*b*. For comparison, left light 714 and right light 716 are focused to the same PD 712*a* of an image pixel.

It is appreciated that coating layer 703 will significantly reduce the periodical surface structure of a micro-lens covered pixel array, thus it will significantly reduce the reflective diffraction that may cause petal flare suffered by the image sensor. Coating layer 703 may also decrease the sensitivity of the phase detection of PDAF pixel units. PDAF micro-lens 722 will bring back the sensitivity of the phase detection of PDAF pixel units.

Accordingly, a method for manufacturing an image sensor is disclosed. The method comprise forming a micro-lens array (702*a*/702*b*/702*c*/702*d*) on an image sensor pixel array (100/600/700). The image sensor pixel array comprises a plurality of image pixel units (102) for gathering image information; and a plurality of PDAF pixel units (101) for gathering phase information. The method further comprises forming a coating layer (703) on the micro-lens array, and flattening the surface of the coating layer across the micro-lens array. The method also comprises forming a PDAF micro-lens (722/922) on the coating layer, wherein the PDAF micro-lens covers a PDAF pixel unit (101 including 101*a*/101*b* or 902*b*).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor pixel array, comprising:
   a plurality of image pixels to gather image information; and
   a plurality of phase detection auto-focus (PDAF) pixel units to gather phase information,
   wherein:
   each of the PDAF pixel units is substantially surrounded by the image pixels;
   each of the PDAF pixel units includes at least one PDAF pixel, wherein:
   the PDAF pixel includes a first photodiode (PD) disposed in a semiconductor substrate and a first micro-lens covers the PDAF pixel;
   the image pixel includes a second PD disposed in the semiconductor substrate and it second micro-lens covers the image pixel, wherein:
   the first PD is identical to the second PD, and the first micro-lens is identical to the second micro-lens; and
   a coating layer disposed on both the first micro-lenses and the second micro-lenses, wherein the coating layer forms a flattened surface across the image sensor pixel array;
   a PDAF micro-lens disposed on the coating layer, wherein the PDAF micro-lens covers a PDAF pixel unit;
   wherein a refractive index of the coating layer is lower than a refractive index of the first micro-lens and the second micro-lens; and
   wherein a refractive index of the PDAF micro-lens is lower than the refractive index of the coating layer.

2. The image sensor pixel array of claim 1, further comprising:
   a first interlayer dielectric layer disposed on the semiconductor substrate;
   a color filter array disposed on the first interlayer dielectric layer;
   a second interlayer dielectric layer disposed on the color filter array.

3. The image sensor pixel array of claim 2, wherein a refractive index of the second interlayer dielectric layer is not lower than a refractive index of the first micro-lens and the second micro-lens.

4. The image sensor pixel array of claim 1, wherein a PDAF pixel unit includes two PDAF pixels adjacent to each other arranged to form a 2×1 pattern.

5. The image sensor pixel array of claim 1, wherein a PDAF pixel unit includes four PDAF pixels adjacent to each other arranged to form a 2×2 pattern.

6. The image sensor pixel array of claim 4, wherein the PDAF micro-lens covers both PDAF pixels of the PDAF pixel units.

7. The image sensor pixel array of claim 6, wherein the PDAF pixels of the PDAF pixel units include green color filters aligned with first micro-lenses of the PDAF pixels.

8. The image sensor pixel array of claim 4, wherein a left half of the incident light is directed and focused to a first PDAF pixel of the PDAF pixel unit, and a right half of the incident light is directed and focused to a second pixel of the PDAF pixel unit.

9. The image sensor pixel array of claim 1, further comprising isolation regions between adjacent PDs in the semiconductor substrate.

10. The image sensor pixel array of claim 1, further comprising isolation regions between adjacent PDs in the semiconductor substrate, except between adjacent PDs of the PDAF pixels.

11. The image sensor pixel array of claim 1, wherein the PDAF pixel unit includes a single half-shield (HS) PDAF pixel.

12. The image sensor pixel array of claim 11, wherein the HS PDAF pixel includes a half shield, wherein the half shield blocks a first half of the incident light, and a second half of the incident light passes through a clear filter in the HS PDAF pixel.

13. The image sensor pixel array of claim 12, wherein the half shield blocks a left half of the incident light, and a right half of the incident light passes through the clear filter in the left half of the HS PDAF pixel.

14. The linage sensor pixel array of claim 12, wherein the half shield blocks a right half of the incident light, and a left half of the incident light passes through the clear filter in the right half of the HS PDAF pixel.

15. A method for manufacturing an image sensor, comprising:
- forming a micro-lens array on an image sensor pixel array, wherein the image sensor pixel array comprising:
  - a plurality of image pixel units for gathering image information; and
  - a plurality of phase detection auto-focus (PDAF) pixel units for gathering phase information;
- forming a coating layer on the micro-lens array;
- flattening a surface of the coating layer across the micro-lens array;
- forming a PDAF micro-lens on the coating layer, wherein the PDAF micro-lens covers a PDAF pixel unit;
- wherein a refractive index of the coating layer is lower than a refractive index of the micro-lens array; and
- wherein a refractive index of the PDAF micro-lens is lower than the refractive index of the coating layer.

* * * * *